Figure 1:
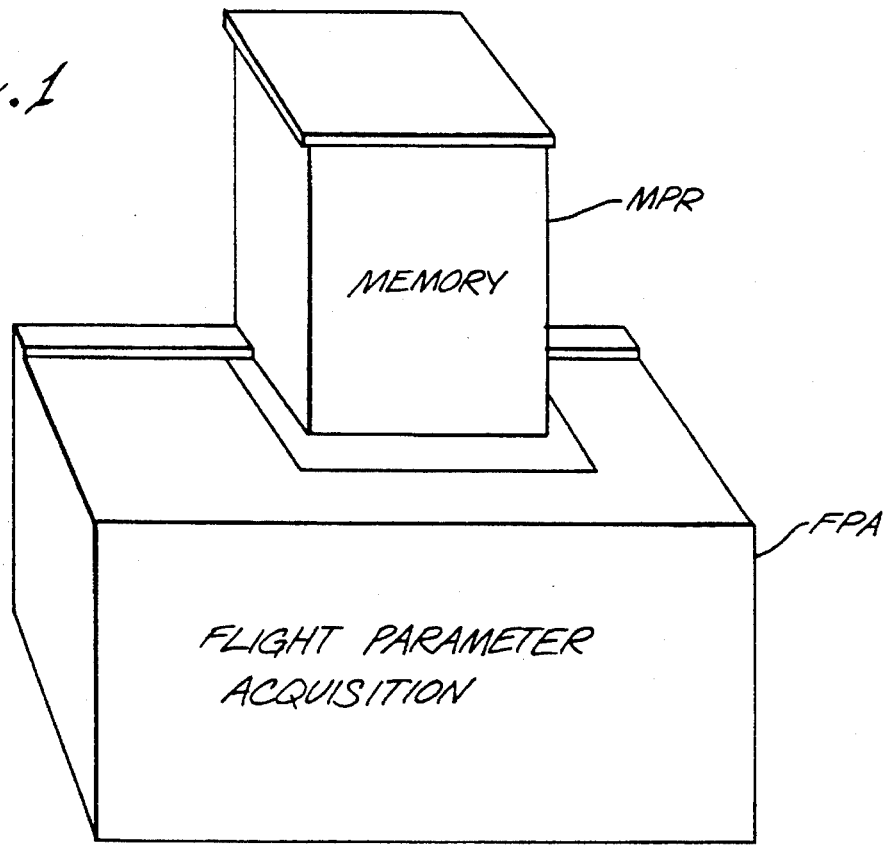

United States Patent [19]

Clavelloux et al.

[11] Patent Number: 5,508,922
[45] Date of Patent: Apr. 16, 1996

[54] FLIGHT RECORDERS WITH STATIC ELECTRONICS MEMORY

[75] Inventors: Michel Clavelloux, Montlhery; Maurice Ropert, Plaisir, both of France

[73] Assignee: Electronique Serge Dassault, France

[21] Appl. No.: 706,766

[22] Filed: May 29, 1991

Related U.S. Application Data

[63] Continuation of Ser. No. 455,812, Dec. 20, 1989, Pat. No. 5,053,967, which is a continuation of Ser. No. 102,382, Sep. 28, 1987, abandoned.

[30] Foreign Application Priority Data

Sep. 30, 1986 [FR] France .................... 86 13616

[51] Int. Cl.$^6$ .............................. G11B 23/02; G11B 5/00
[52] U.S. Cl. ........................ 364/424.06; 169/48
[58] Field of Search ................. 364/424.04, 424.06; 340/945, 870.11, 870.28; 365/230.01, 230.04; 360/60; 73/178 R; 169/48

[56] References Cited

U.S. PATENT DOCUMENTS

| | | | |
|---|---|---|---|
| 4,091,924 | 5/1978 | Newton | 206/389 |
| 4,409,670 | 10/1983 | Herndon et al. | 364/900 |
| 4,470,116 | 9/1984 | Ratchford | 364/424.04 |
| 4,510,803 | 4/1985 | Perara | 73/178 R |
| 4,600,449 | 7/1986 | White et al. | 148/407 |
| 4,616,694 | 10/1986 | Hsieh | 169/48 |
| 4,646,241 | 2/1987 | Ratchford et al. | 364/424.06 |
| 4,656,585 | 4/1987 | Stephenson | 364/424.06 |
| 4,660,145 | 4/1987 | Hansen | 364/424.06 |
| 4,682,292 | 7/1987 | Bue et al. | 364/424.06 |
| 4,694,119 | 9/1987 | Groenewegen | 169/48 |
| 4,729,102 | 3/1988 | Miller, Jr. et al. | 314/424.06 |
| 4,944,401 | 7/1990 | Groenewegen | 206/521 |
| 4,970,648 | 11/1990 | Capots | 364/424.06 |
| 5,269,378 | 12/1993 | Maas et al. | 169/48 |
| 5,283,643 | 2/1994 | Fujimoto | 340/973 |

*Primary Examiner*—Vincent N. Trans
*Attorney, Agent, or Firm*—Christie, Parker & Hale

[57] ABSTRACT

A flight recorder (MPV) is contained within a two-walled chassis (11, 13) of which the walls are separated by a fire-resistant material (12). The memory means consist of hybrid circuits (H1–H8) of the EEPROM type. These are associated with a control card that may act as a fuse, The hybrid circuits (H1–H8) are mounted so as to be pressure-resistant. The flight parameters are alternating recorded on two memory cards (MC1 and MC2) and also in their hybrid circuits.

24 Claims, 8 Drawing Sheets

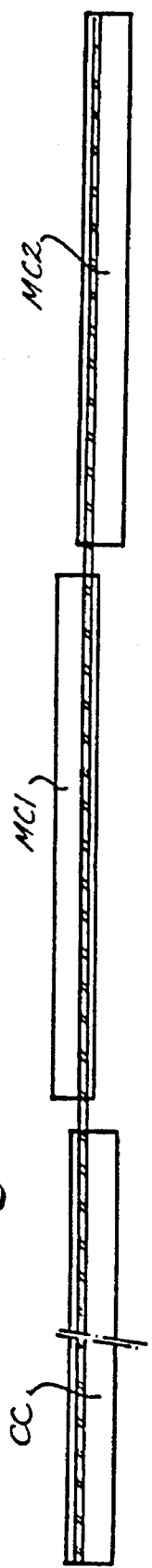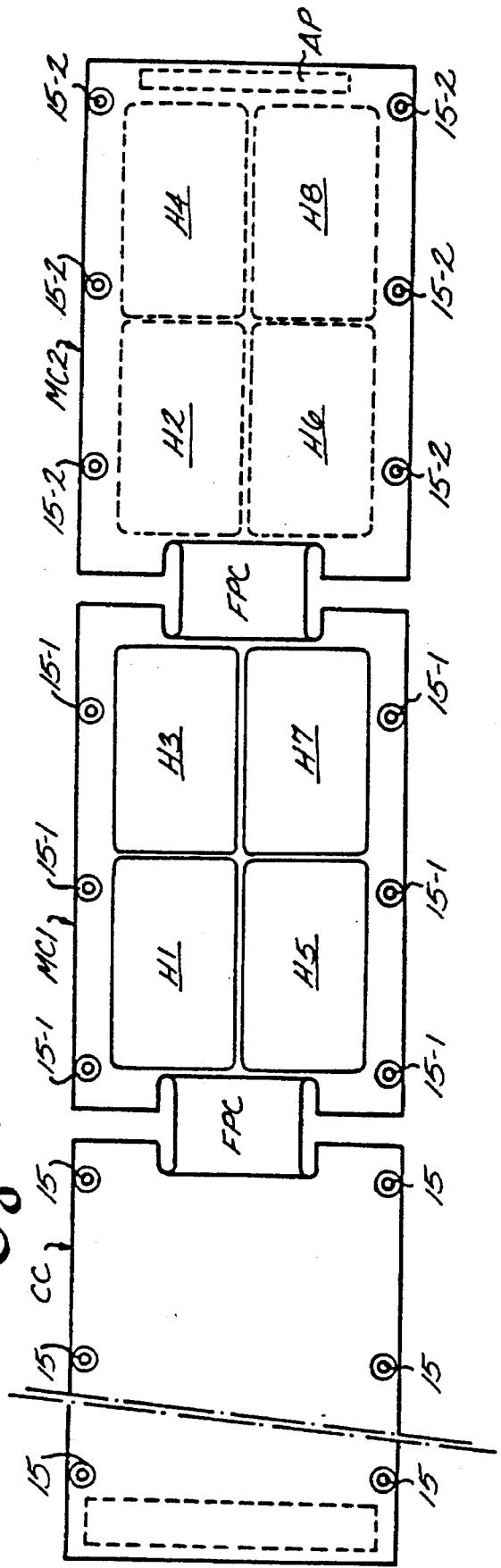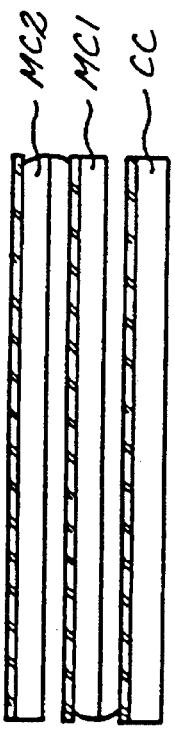

FLIGHT RECORDERS WITH STATIC ELECTRONICS MEMORY

CROSS-REFERENCE TO RELATED APPLICATIONS

This application is a continuation of U.S. patent application No. 07/455,812, filed Dec. 20, 1989, now U.S. Pat. No. 5,053,967 which is a continuation of U.S. patent application No. 07/102,382, filed Sep. 28, 1987, and now abandoned.

The present invention concerns flight-parameter recorders, or more briefly, flight recorders.

Installed aboard civilian or military aircraft, the purpose of flight recorders is to collect the essential data of the flight in progress and to record data of one or more flights for ultimate read-out. Such read-out may take place for an eventless flight. Unfortunately it may also be necessary in case of a possibly serious accident.

The latter eventuality requires that recorders must meet extremely adverse survival conditions.

To-date the flight recorder has been based on magnetic tape. Survival conditions are provided to the extent possible by suitably protecting the tape recorder.

Those flight recorders evince mediocre reliability because of their moving magnetic parts and the degradation of the magnetic tape in a humid atmosphere. It is desired therefore to replace them with higher-performance equipment.

Accordingly the main object of the present invention is to create a flight recorder meeting such exceedingly adverse survival conditions as:

impact strength of 10,000 m/s$^2$ for 5 ms along each of its three main axes, crush resistance to 22,500 Newtons for 5 minutes along each of its main three orthogonal axes, immersion for 24 h in any one of the liquids present in the aircraft (fuel, lubricant, hydraulic liquid, fire extinguisher), also in sea water, punch-resistance to the drop of a 225 kg weight with a punch of 0.32 cm$^2$ cross-section released 3 m above any point of the recorder chassis, 30-minute flame-resistance of 1,100° C. covering 50% of the chassis surface, Immersion for 30 days in sea water at a depth of at least 3,000 meters.

Another object of the present invention is create a flight recorder comprising a static electronic memory, whereby new problems are raised both regarding its mechanical protection and the reliable preservation of the data recorded in the memory.

As shall be seen below in the detailed description to follow, a variety of problems must be resolved to that end.

The present invention proposes a flight recorder of the type comprising a protection chassis crossed by electrical supply and signal cables to the memory means inside the chassis.

In a first design of the invention, the chassis comprises two walls separated by a fire-protecting substance; the memory means comprise non-volatile memory hybrid circuits with electric re-writing in particular the EEPROM type, that do not require an independent power supply to retain the data and may be controlled from an external processor by means of said supply and signal cables; the inner chassis wall is permeable to high-pressure water and contains the wedged printed-circuit boards holding said hybrid circuits; lastly, the hybrid circuits are in the form of cases containing the integrated circuit chips on ceramic substrates, further being filled with a product that can at least withstand the above mentioned mechanical stresses.

In a first embodiment of the invention, the metal cases of the hybrid circuits are provided with a cover which is also metallic and contain an incompressible, inert liquid.

In a second embodiment mode, the hybrid-circuit metal cases comprise an open side away from their connection terminals, the chips and these terminals being coated with resin while the remaining case inside is filled with a solid silicone.

Moreover an anticorrosion product, in particular one which is silicone-based, advantageously is applied to the two sides of the printed-circuit boards or cards.

More specifically, the printed-circuit cards are braced inside the inner enclosure wall and are held in place by means of glass micro-spheres, said cards being interconnected by flexible printed circuits.

In another design of the invention, the memory means comprise at least one hybrid-circuit memory card and one control-circuit card suitable to constitute the interface between the external processor and the memory hybrid circuits.

Very advantageously the control card includes several circuit levels between the input/output connections and at least the write-cables of the memory cards; these various circuit levels act as fuses in case of excessive input potentials; further to protect the memory cards from these excessive voltages; at least one of the memory cards then comprises a so-called "plug" zone accepting a memory-access connector in case of malfunctioning control card, illustratively following aircraft accident.

Preferably all input connections toward the memory means are protected in parallel by fast unidirectional Zener diodes.

In still another design of the invention, consecutive measurements of the same magnitude to be recorded are alternatingly fed to at least two memory hybrid circuit assemblies; further, consecutive sets of data to be recorded in each assembly are sequentially fed to its different hybrid circuits.

Very advantageously, the various memory assemblies are mounted on separate printed-circuit boards controlled through separate channels by the control card.

In another light, any flight is the object of an alternating recording of its parameters (in particular by means of parameter-recording cycles wherein certain parameters may be super-connected, that is, sampled several times), in two different memory zones. In case of partial or total malfunction of one of the zones, all of the flight recording shall be at half rate. Obviously such a half-rate recording also may be obtained on command.

Very advantageously each set of flight parameters to be recorded (hereafter called such a set shall be termed "flight module") ordinarily contains an integral number of cycles each comprising all the flight parameters to be recorded.

As a result it is possible to compress data in a particular significant manner which is the object of another design of the invention.

In that case each flight module in principle comprises at the start a reference cycle with a block of recorded data representing the complete coding of the set of parameters to record. This reference cycle is followed by so-called secondary cycles comprising data blocks consisting each of an identifier that may assume at least three different states whereas the remainder of the block shall be:

inexistant if the identifier shows that the flight parameter remained constant relative to its previous value within a selected precision, a restricted number of bits if the indicator shows that the flight parameter varied with respect to its previous value only within a selected range definable by this restricted number of bits, the totality of the coding bits in the other case, that is if the flight-parameter variation is the biggest.

Preferably each flight module is associated with the initial recording of flight identification, flight-module identification and time elapsed since the beginning of flight.

Presently another novel design of the invention shall be discussed.

Each block of data relating to a flight cycle preferably shall be followed by the indication of the number of bits in this block; each set of data defining a flight module similarly is followed by the display of the number of bits in this set, then by at least one synchronizing signal.

The above is significant because the power supply to the memory may be interrupted accidentally or most of the time the flight parameters are recorded until the power supply aboard the aircraft goes off, and consequently it is difficult to provide a special marker for end of flight.

Using the above mentioned means, reset in the memory following power supply interruption takes place by moving through the memory in the reverse order to find in it first the synchronizing signals for the most recent flight module, then to follow the increasingly more time-remote flight modules.

Obviously the memory shifts in loop, that is, when full, the recent information erases the old one. However, as regards the design considered herein, this old information is not necessarily the oldest one, contrary to the case of magnetic tapes.

Accordingly the preliminary reset phases in the memory of the invention and just described above advantageously proceed until the oldest flight has been determined of which all the flight modules are stored in the memory.

Other features and advantages of the invention shall become clearer in relation to the detailed description below and the attached drawings.

Figure 2:
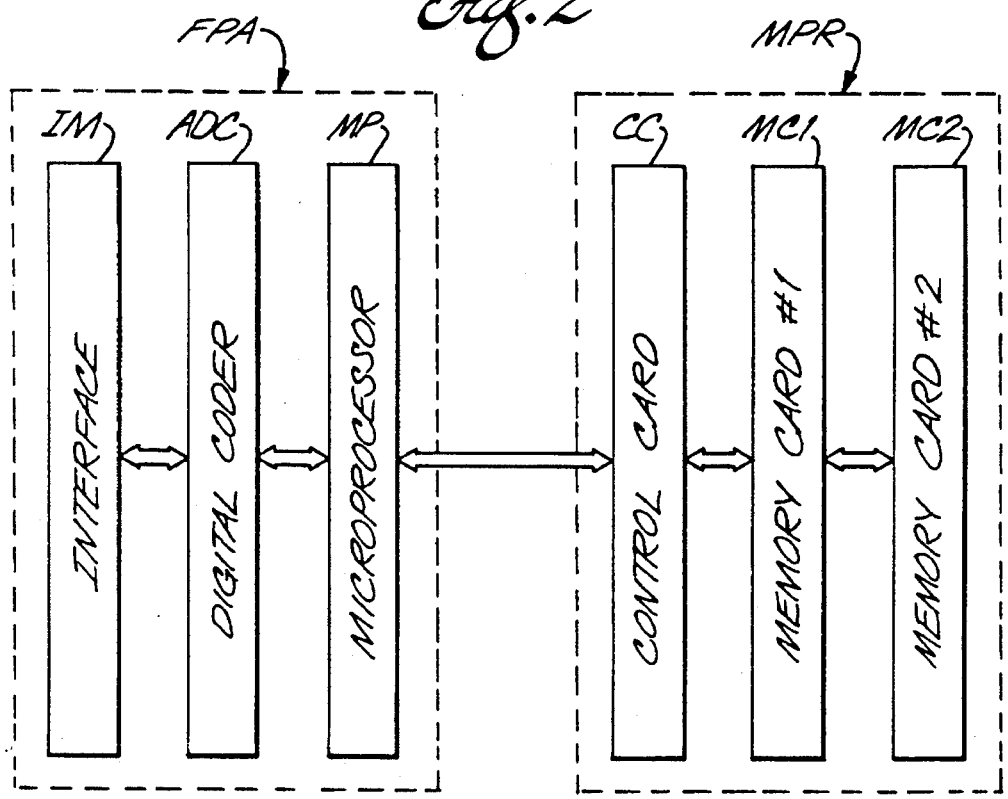

FIG. 1 is a schematic perspective of a memory of the invention cooperating with a flight-acquisition apparatus, FIG. 2 is the electrical block-diagram of the two apparatus of FIG. 1.

Figure 3A:
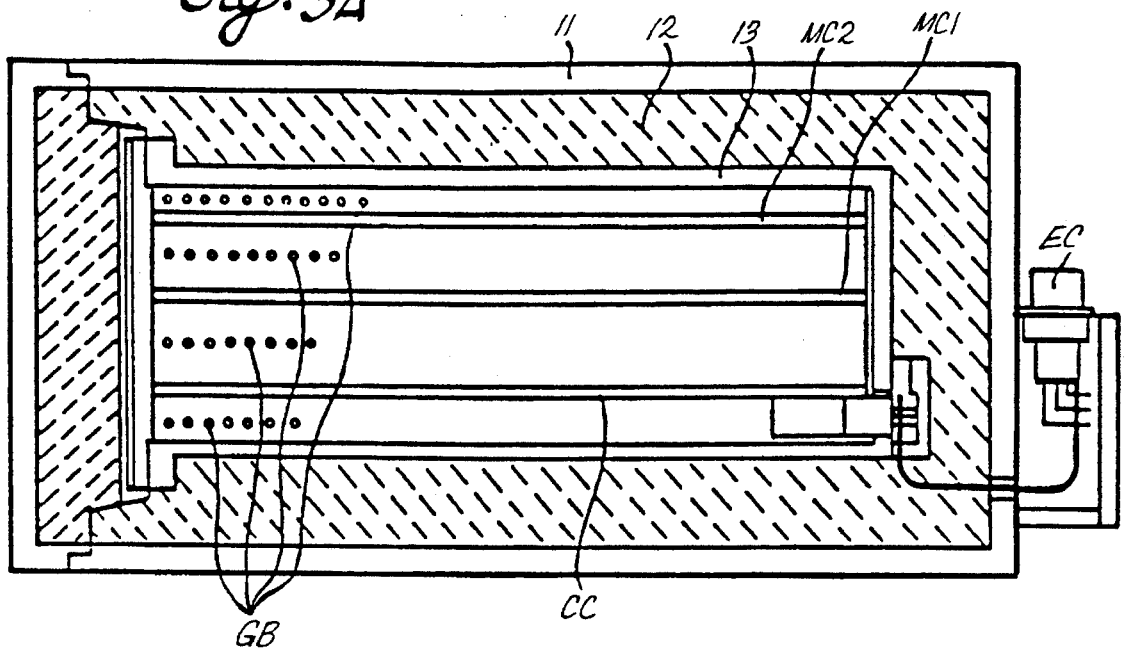
Figure 3B:
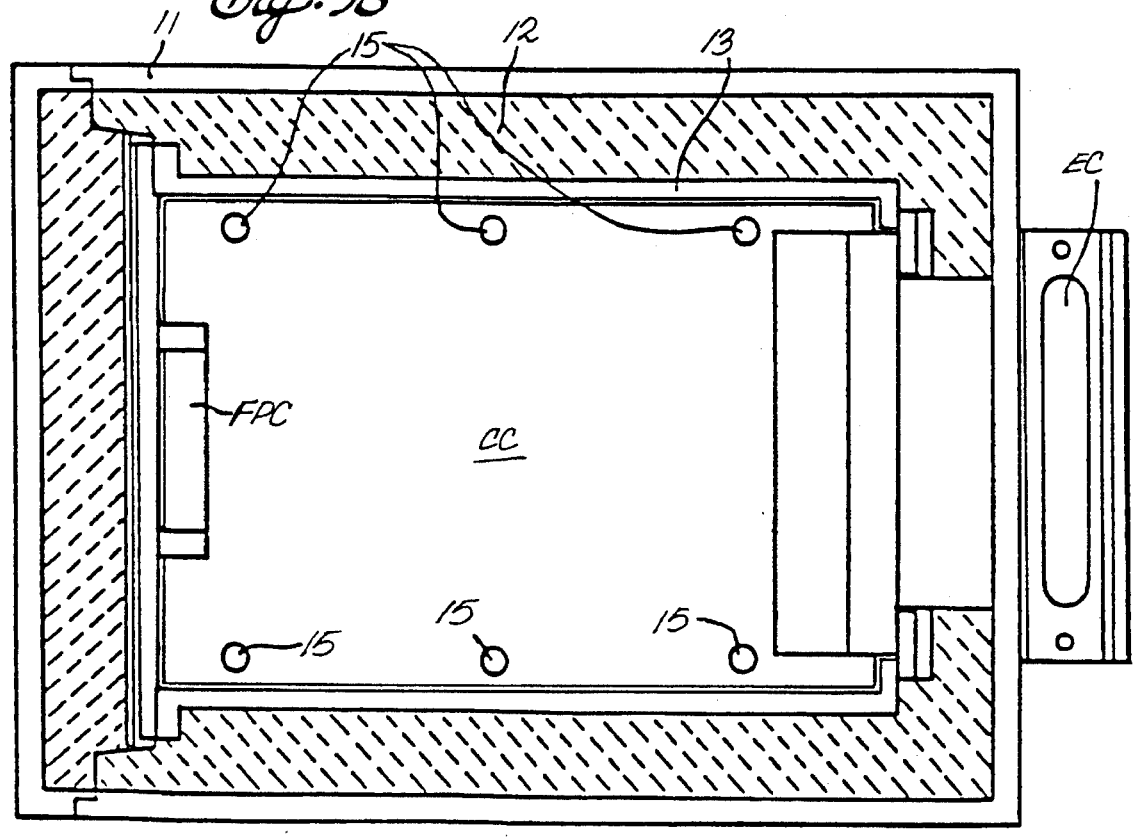
Figure 5:
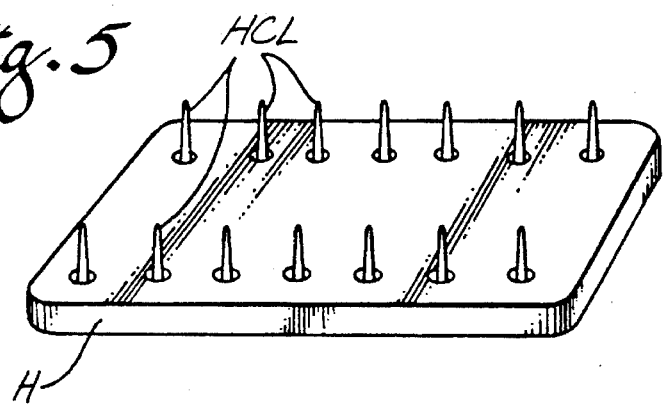
Figure 5A:
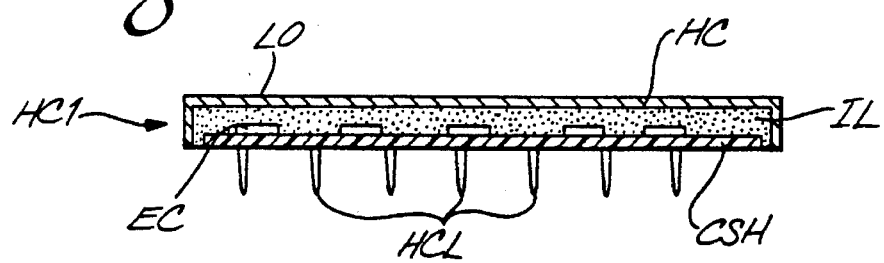
Figure 5B:
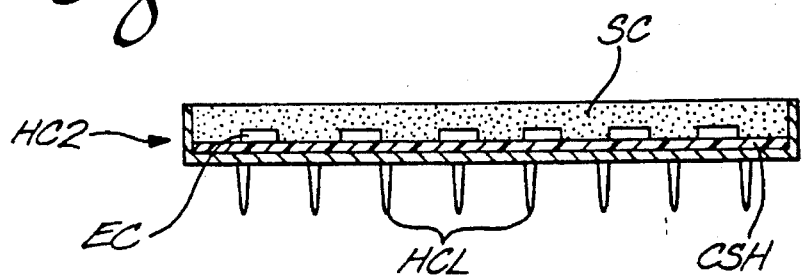
Figure 6:
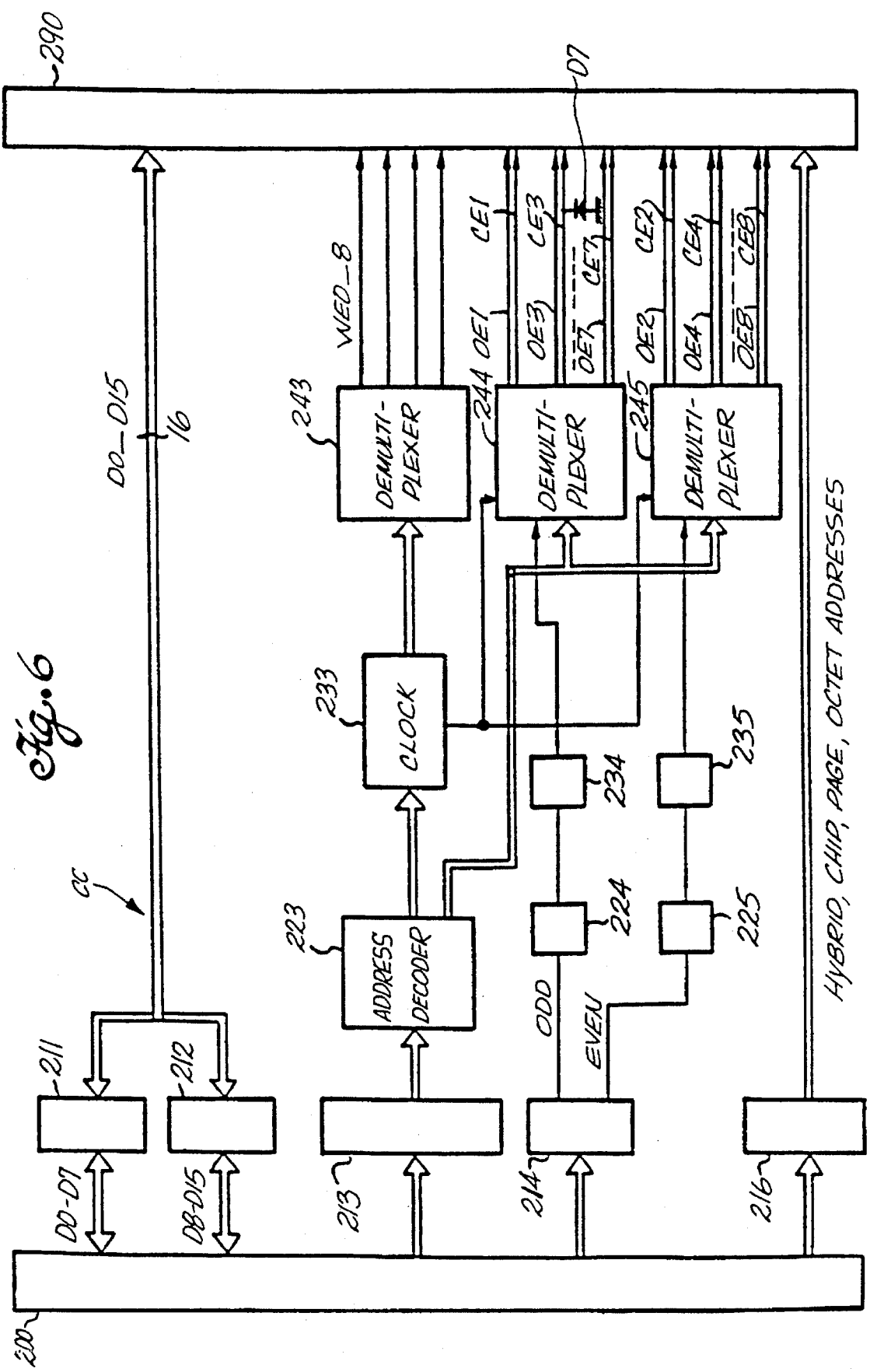
Figure 7:
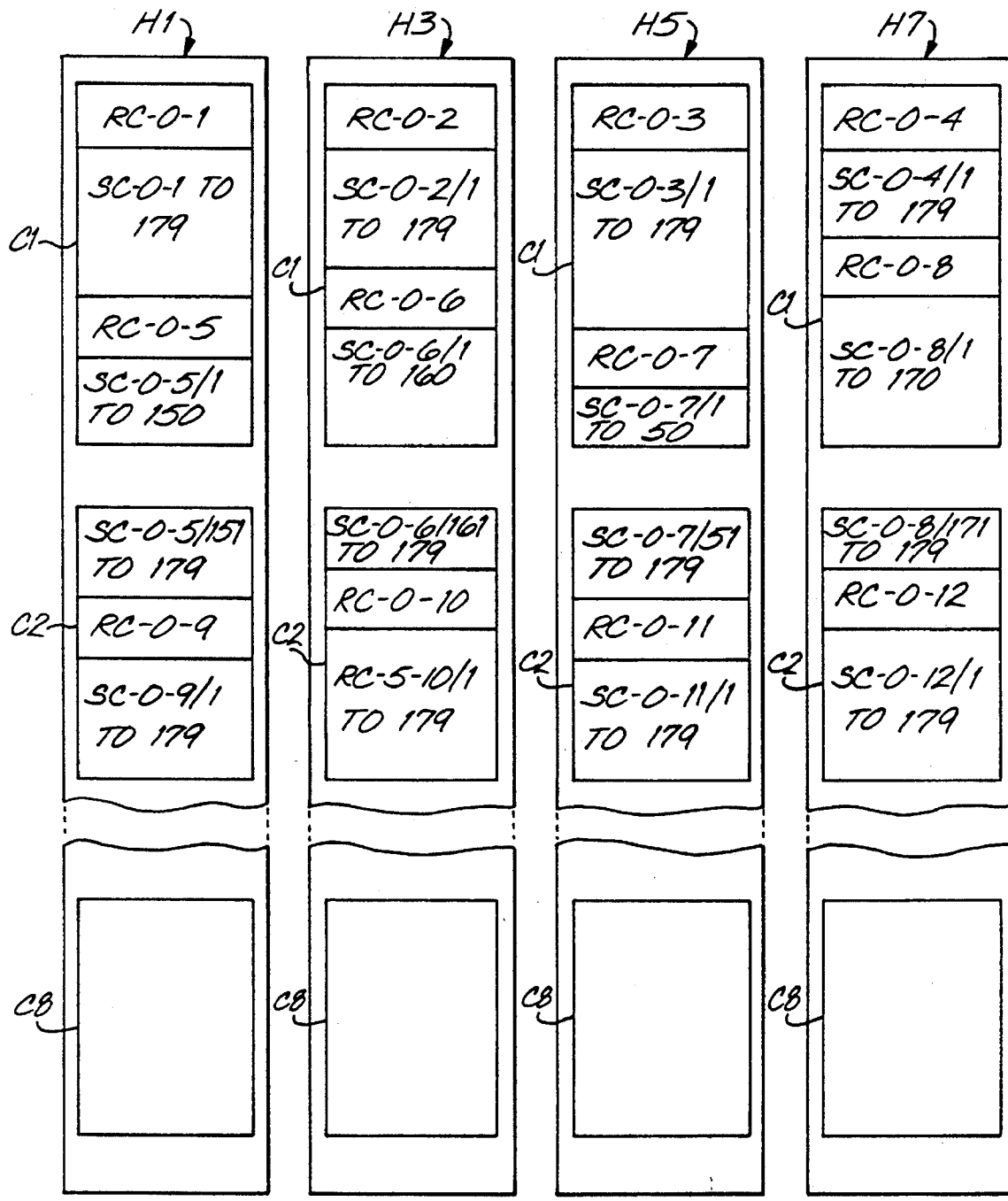
Figure 8:
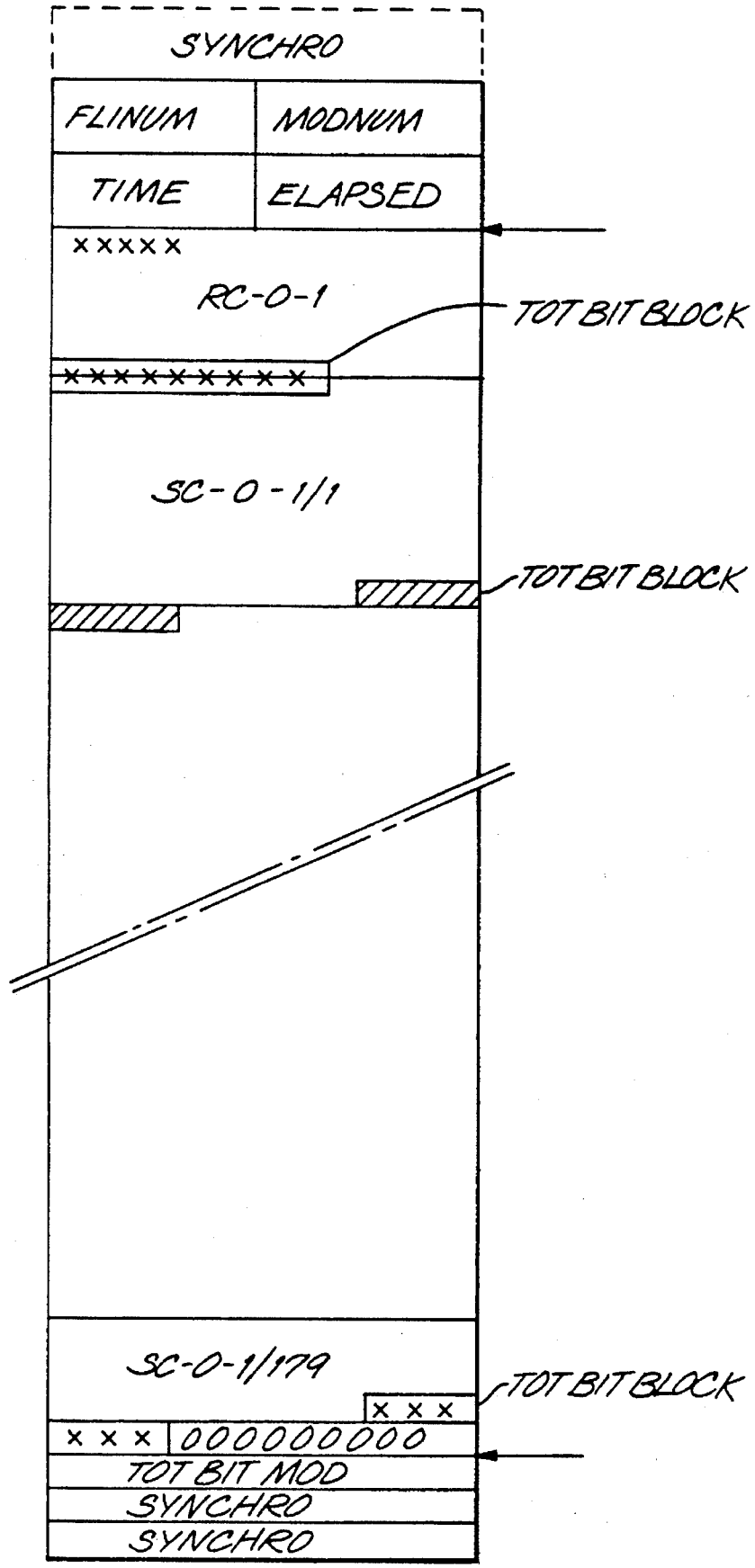
Figure 9:
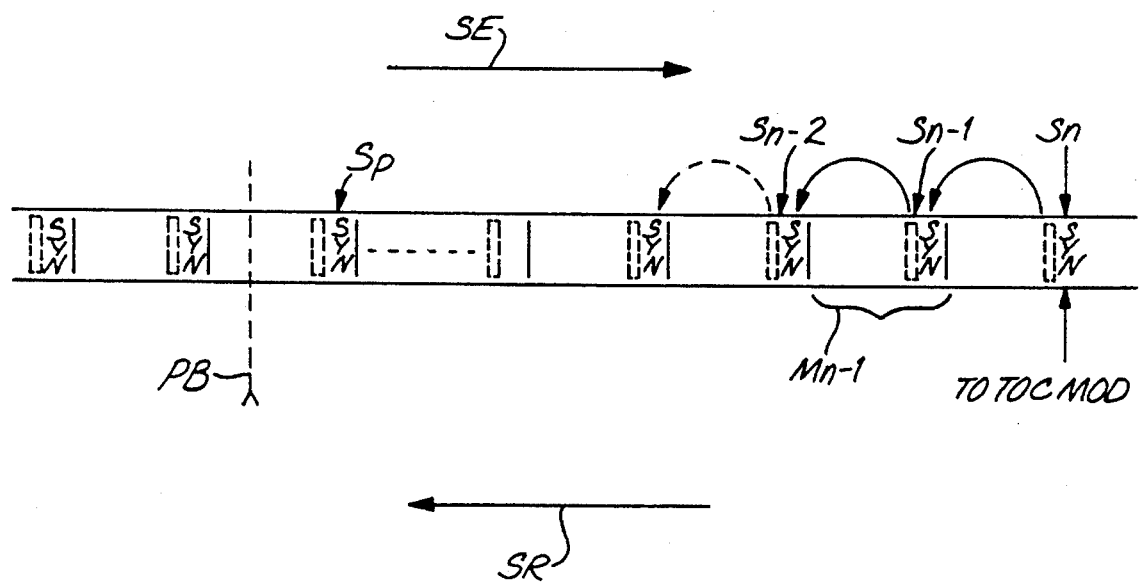

FIGS. 3A and 3B are vertical and horizontal sections resp. of the memory of the invention, FIGS. 4A, 4B and 4C illustrate the connections and the structures of the three cards in the memory of the invention, FIGS. 5, 5A and 5B resp. are a perspective of a hybrid circuit used in the invention and cross-sections of two variations of this hybrid circuit, FIG. 6 is block diagram of the control card of the memory of the invention, FIG. 7 is a memory mapping schematic elucidating the operation of the equipment of the invention, FIG. 8 is another memory mapping schematic elucidating the operation of the equipment of the invention, and FIG. 9 is a third schematic of memory mapping elucidating the operation of the equipment of the invention.

The attached drawings comprise in many cases fixed-feature data. Consequently they not only elucidate the detailed description below, but where called for may contribute to the definition of the intention.

In FIG. 1, the memory proper of the flight recorder, MPR, cooperates with a flight-parameter acquisition apparatus FPA.

By itself the apparatus FPA is outside the present invention. It may consist of a conventional acquisition device such as marketed by SOCIETE DE FABRICATIONS D'INSTRUMENTS DE MESURE, 13 rue Ramolfo Garnier, 91300 Massy, France.

FIG. 2 shows the electrical block diagram of this acquisition apparatus, and its understanding is useful in better grasping the invention. Illustratively this apparatus comprises interface means IM with the diverse sensors aboard an aircraft and if required is followed by an analogue digital coder ADC, then by a microprocessor MP defining the set of flight parameters that the memory of the invention must record.

Still on FIG. 2, the memory MPR comprises, among its electric components, a control card CC, a first memory card MC1 and a second memory card MC2.

FIGS. 3A and 3B show the equipment being housed within an outer chassis 11 which is that shown in FIG. 1.

The chassis provides overall external mechanical protection, in particular against crushing and piercing that was mentioned above. This is feasible by means of a 4 mm thick steel case.

A second wall 13 is provided inside the first, with a fire-resistant material 12 placed between the two walls Illustratively this fire-resistant material is the so-called AEROCOAT marketed by the SOCIETE AEROSPATIALE (France). This material is based on chemically bonded water and is placed 13 mm thick between the two walls 11 and 13. It vaporizes when heated, absorbing a maximum of calories. The evaporation escapes through pores in the outer wall 11 which open at high temperature.

The three cards of the memory protected by the invention are mounted inside the inner wall 13.

As shown by FIGS. 4A through 4C, there is a control card CC, a first memory card MC1 and a second memory card MC2, all the same format. These cards are mutually connected by a flexible printed circuit FPC. The memory card MC1, which is between the other two, presents its components on the side opposite that for the other two adjacent cards.

FIG. 4C shows how these cards can be stacked to assume a pallelipiped shape. The cards in that case are provided with spacer means, namely near the orifices 15 of the control card CC, near the orifices 15-1 for the memory card MC1 and near orifices 15-2 for the memory card MC2.

The FIG. 4 further show that the memory card MC1 comprises four hybrids H1, H3, H5, H7, and the card MC2 comprises four hybrids H2, H4, H6, H8. The latter card further includes at its end a plug AP near the flexible printed circuit FPC to allow fixing an auxiliary connector. As shall be seen further below, this auxiliary connector allows access to the memory cards if in some circumstance the control card no longer can be used.

Keeping in mind FIG. 4C and returning to FIGS. 3: The space taken up by these cards arrayed inside the case 13 by its geometric envelope does fill the volume of this case. The remaining spaces are entirely taken up by glass balls GB (FIG. 3A). Advantageously the size of these glass balls shall be between 45 and 90 microns.

Be it also noted that the thickness of the inner wall 13 is 3 mm of stainless steel. The connector of the control card CC communicates with the external connector EC through a chamfered window to pass the connecting wires. This chamfered window itself is protected by a second steel wall. This window is closed and also is provided with the fire-resistant material AEROCOAT.

Tests have shown that such a system meets the above cited conditions concerning crushing, piercing and fire-resistance.

The same applies to shock resistance, considering that the hybrid circuit modules that presently shall be discussed withstand 3,000 g.

These hybrid modules are schematically illustrated in FIG. 5 upside-down, that is with their connection lugs HCL pointing up.

FIG. 5A shows a first embodiment of these hybrid modules and denoted HC1. The metal case of the hybrid modules here is closed by an upper cover HC provided with a locating orifice LO. The electronic chips EC are inside on the ceramic substrate CSH of the hybrid circuit. The lugs HCL also are mounted on this substrate and pass through the glass balls in known manner to cross the metal wall of the case. Following assembly, an inert liquid IL which is non-polluting with respect to the electronic chips—for instance FLUORINERT reference FC43 marketed by 3M Inc. is introduced through the orifice in the cover HC. Thereupon this cover is sealed by a solder SFL.

It was found that this apparatus withstands pressures of about 1,000 bars.

FIG. 5B shows a second embodiment mode of the hybrid circuits. This mode also comprises the ceramic substrate CSH with chips EC and with the connection lugs HCL. This time however the case BH2 now is open at its upper part. A hard resin which is non-polluting relative to the chips is spread (one or a few drops suffice) on the chips and also on the lugs. The resin may be that sold by HYSOL as ES4228 (89 shore D hardness). The remainder of the case is filled with a solid silicone composition SC of average hardness and with a low expansion coefficient. Illustratively this composition is DOW CORNING's RTV 31-40 (Shore hardness A 25, expansion coefficient: $300\times10^{-6}$). This second embodiment mode of the case was found suitable to withstand a pressure of about 850 bars.

When so outfitted, the memory of the invention meets the above mentioned acceleration and pressure requirements. Remains to be solved the anti-corrosion strength and in particular resistance to marine corrosion, which basically is more complex to achieve.

To that end a silicone product such as the above mentioned RTV 31-40 is added. In particular this silicone product may be added when the hybrid circuits are based on the second embodiment mode (FIG. 5B). in case the hybrid circuit belongs to the first embodiment mode (FIG. 5A), a thickness of 1–2 mm of this silicone product may be spread on the printed-circuit boards (cards) as well as on the connection lugs, in particular of the hybrid circuits, on these cards or boards.

Contrary to the case of the magnetic tape recorders of the prior art, the present invention also provides for the safety of the data as regards the electronics proper.

In a first design of the electronic-data protection, the control card is made to act as a fuse. This is indicated schematically in the block diagram of FIG. 6.

200 denotes the connector to the microprocessor MP of FIG. 2 (this connector 200 corresponds to the grouping of the connectors EC and the connection to the card CC of FIGS. 3A and 3B).

As shown illustratively in FIG. 6, all the input signals are grounded through unidirectional, fast Zener diodes ZD allowing thereby to clip all transients less than −1 v or above +7 v.

Data bus conductors $D_o$ through $D_7$ and further $D_8$ through $D_{15}$ start from the connector 200 and respectively lead to two line transmitter/receiver circuits 211 and 212. Their outputs define the complete data bus with 16 wires $D_o$ through $D_{15}$ consolidated into a connector 290 and then passing toward the memory cards through the flexible printed circuit FPC (FIG. 3).

The input connector 200 also receives address data. Part of these are fed to an address line circuit 213 followed by an address decoder 223. Latter feeds first a clock 233, then a demultiplexer 243. The demultiplexer emits write-authorization signals (write-enable) denoted WE 0 through 8 which are transmitted over four wires.

The clock also emits control signals to two other demultiplexers 244 and 245 each to provide other "write" control signals to the hybrid circuits H1, H3, H5 and H7 on one hand and to H2, H4, H6 and H8 on the other. These signals include output authorization signals (output enable) OE and chip ratification (chip-enable) signals CE.

The address decoder 223 also transmits the address signals to be decoded to the demultiplexers 244 and 245.

Other address signals from the input connector 200 are fed to a line circuit 214 which in turn transmits them as even and odd addresses. The former concern the demultiplexer 244 and the latter the demultiplexer 245. These parity-dependent control signals are fed through two intermediate stages 224 and 234 on one hand, and two further intermediate stages 225 and 235 on the other hand, whereby the same number of logic-circuit layers between all the inputs and all the outputs of the memory card are obtained.

Lastly the remainder of the address signals is received by a line circuit 216 which processes octet address-signals, page signals in a chip, further chip signals and hybrid circuit signals transmitted to the output connector 290.

It is clear from the above, to the expert that the control signals from the two memories are transmitted separately, or more, when write-in takes place into them. Moreover, write-in is virtually "paralyzed" unless all signals are present and in the right order.

By using four circuit layers inside the control card CC, this card also can act as a fuse if excessively high voltages were to appear at the input connector 200. This fuse function is completed for safety by that of the Zener diodes ZD.

There is another safety element which shall be discussed more completely below and which consists in the data being systematically divided into even and odd pairs depending on the order in which they appear and will be fed alternatingly to the memory cards themselves and also to the hybrid circuits which are their basic components in the described embodiment mode.

At present appropriately the auxiliary connector AP of FIG. 4B should be discussed. After the control card CC has acted as a fuse for whatever reason, the data in the memory remains accessible by mounting an auxiliary connector on the plug AP.

The recorded data also are protected against electromagnetism. This protection is due to the three metal enclosures shown herein, namely the hybrid circuits and the two enclosures 13 and 11. A fourth and external enclosure is added, inside which is housed the assembly of two apparatus shown in FIG. 1.

It is practically impossible to completely erase the memory, because such a complete erasure would required:

the presence of a voltage>15 v on each of the four OE wires each connected to the eight hybrids. But there is no other voltage than the supply of +5 v inside the protected memory case, and the already mentioned Zener diodes eliminate any voltage>7 v at the case input, furthermore low voltages also would have to be present at the WE and EC connectors. The WE signals pass through four distinct connections. The EC signals pass through eight wires each connected to one of the hybrids. Because these wires are connected to the five controls of the protected case, and these controls must appear in a very precise and repetitive time sequence for each hybrid, it is practically impossible to write-in incorrectly. Moreover, in case of interruption, some of these wires are brought back to a voltage of +5 v or to ground so as to actuate the read position.

Moreover, by preferentially using integrated circuit chips of 64 kbits EEPROM such as those sold by the firm SEEQ, the advantage of these chips is gained, namely that all "write" possibilities are inhibited if the supply voltage of +5 v drops below +3 v, for instance if due to interruption or grounding the +5 v supply.

Again partial erasure of the memory is unlikely, because the following conditions would have to be present:

the addressing is in an already written-in memory zone, write-enable signal is present, the sequencing between the write-in signals, the address sampling and the data sampling would have to be like a write-in cycle.

Again, if hypothetically all these unfavorable circumstances were met, only one page of one chip could be erased.

Presently it will be seen that the invention offers design features to limit the drawbacks.

Beforehand however another design of the invention should be considered, which concerns data compression allowing better use of the static electronic memories.

It is assumed there are 64 flight parameters to be recorded, while some parameter recordings may be redundant.

To store into the memory, therefore, the flight is resolved into 64-parameter cycles each in principle being coded by 12 bits.

First there shall be cycle sequencing depending on the order in which appears a cycle O, hence odd, which shall be routed to the odd hybrids of the memory card #1 (odd) and the next cycle shall be an E or even cycle which shall be routed to the even hybrids of the memory card #2 (even).

In other words, considering two consecutive flight cycles each comprising two consecutive samples of the same flight parameter (sampled once a cycle), one of the samples shall be routed into one of the memory cards and the other into the other memory card.

Now the data compression causes the definition of reference cycles (RC-O and RC-E) each followed by 179 secondary cycles (SC-O and SC-E). The entirety consisting of one reference cycle and 179 secondary cycles covers, as regards the recording of the flight parameters, one "flight module" illustratively lasting one minute of flight.

Obviously a flight module shall comprise 180 odd cycles, of which one reference cycle, and 180 even cycles, of which one reference cycle, when in the normal mode.

Henceforth only one of these flight modules shall be considered, namely in its odd part, the even part being identical.

As shown by FIGS. 7 and 8, such a flight module starts by a reference cycle RC-O-1 which comprises the total recording of all the significant parameters.

Recording this reference cycle R-O-1 shall occupy a certain number of bits in the memory. As shown in FIG. 8, this number of bits constitutes an information TOTBIT-BLOCK recorded directly after the data block relating to the reference cycle RC-O-1.

The next 179 secondary cycles SC-1 to 179 will not cause the integral recording of the binary coding of all the flight parameters. On the contrary, the data are coded as follows:

if, within specific accuracy limits the particular flight parameter did not deviate from its previous value (of the same "cycle"), only two identifying bits shall be recorded, for instance 00, indicating this fact; better yet, only one bit 0, whereby data compression is improved, if relative to its previous value the particular flight parameter varied only within a selected and restricted range, then an identifier, for instance 10, is recorded, which represents this fact, plus a sufficient number of bits to show the variation of the flight parameter, taking into account the selected and restricted range of variation, if, still relative to its previous value, the flight parameter varied outside said restricted range, then the identifier 11 is recorded, illustratively followed by all the bits forming the coding of the flight parameter undergoing substantial variation.

It was found that this compression technique is perfectly applicable to the dynamics of each parameter while also rendering it highly faithfully.

Tests have shown that this data-compression technique allows decreasing by a factor of 6 approximately the required volume of bits relative to the complete recording of the prior art, and to do so without loss of information.

As for the reference cycle, so each secondary Cycle SC so compressed is followed by the indication of the TOTBIT-BLOCK of the number of bits it comprises, taking compression into account.

The procedure continues to the last secondary cycle SC-O-1/179. Its TOTBITBLOCK information is followed by filler bits to complete the last line used in the memory, as shown in FIG. 8.

Thereupon, an indication TOTBITMOD (total bits or octets of a module) is provided that covers a complete line or segment of the memory, followed by two "synchro" indications also in fixed format, such as TOTBITMCD.

Presently the top of FIG. 8 shall be discussed. Before the reference cycle RC-O-1 but after the synchronization information of the preceding flight module, two indications covering one line, ie resp. the flight number FLINUM and the flight modulus number MODNUM. On the following line, the time will be written which has elapsed since the beginning of flight, these data constituting the identity block of the flight module.

FIG. 7 now can be fruitfully examined, as it shows the memory card MC1 of all the blocks forming the odd "cycles" being put in place in the memory.

Illustratively the first reference cycle RC-O-1 is written into the chip C1 of the hybrid H1. It is followed by the n=179 secondary associated cycles denoted by the mark SC-O-1/1 to 179.

The reference cycle RC-O-2 is written into the chip C1 of the hybrid H3, followed by n secondary cycles SC-O-2/1 to 179. The procedure is repeated for the cycle RC-O-3 in the chip C1 of the hybrid H5 together with its seocndary cycles and the cycle RC-O-4 in the chip C1 of the hybrid H7 with its secondary cycles.

After that the reference cycle RC-O-5 returns to the chip C1 of the hybrid H1 where the sequence of these secondary cycles may spread to the chip C2 of the same hybrid, the filling thus taking place in sequence.

The same procedure takes place in the other memory card with the RC-E-1 reference cycles followed by the SC-E-1 to 179 and so on.

FIG. 9 shows the presentation of the consecutive flight modules in the memory by hybrid.

The end of recording takes place by a synchronizing signal (in practice, by a block of two synchronizing signals).

The recording of the data in the hybrid H under consideration took place in the direction SE. The memory of the invention can be implemented without incorporating into it a catalogue (directory) as now shall be shown.

To that end advantageously searches (or resets) in the memory in the SR direction reverse of SE are carried out.

Once the last synchronizing signal Sn has been located, it suffices to read directly above the total number of bits (or octets TOTOCMOD) of the modulus terminated by this synchronization block to arrive at the beginning of this modulus, and so on with the synchron zing signals Sn-1, Sn-2.

Different special conditions may occur, considering for instance that the last module is complete but lacks a synchronizing signal, or that it is incomplete, or that there was aircraft power interruption while a module was being written into a hybrid circuit (break PB, to the left of Sp, with spurious TOTOCMOD, which might be detected for instance by parity error), or that the reset on synchronization straddles the beginning and the end of a hybrid circuit whether the power of the aircraft fail or not, or that the total number of bits of a module straddles the beginning and end addresses of a hybrid (this total consisting of an octet at the end of the hybrid and of another octet at the beginning of the hybrid), or again the memory being totally virgin.

Experience has shown that resetting always is possible using the means of the invention under all the above stated conditions. "Certified flight modules" are determined. In FIG. 9, it is assumed that the TOTOCMOD adjacent to Sn is inaccurate or incomplete. Accordingly the first certified module is Mn-1.

Following that, the certified flight modules can be placed in order. The earliest and the latest flights must be determined, further the address in the memory of their first module and/or of their last module.

Lastly a table indicating the initial addresses on a hybrid circuit may be initialized for a new recording.

Where the memory shall not be prepared for a new recording but instead prior recordings will be searched, it is desirable to go further.

First it is determined which is the earliest flight for which the modules are present in the eight hybrid circuits.

Then it is determined which is the first module to be read-out in this earliest flight, further the hybrid number where this first module is located.

Thereupon a table containing the identification numerals of the identity blocks of the first modules to be restored shall be updated.

Thereupon a table forming the summary of different flights and flight modules may be constituted.

Lastly there is direct access to any flight modules of any flight contained in the memory.

These operations are of practical significance. The expert already will have noted that the present invention replaces the purely sequential recording of a magnetic tape with a recording that is still sequential but distributed inside different material sub-assemblies of a memory.

Because data compression also is provided, quite possibly a flight module on account of substantial variations (whether accidental or otherwise) did assume a size (regarding the required memory size) which substantially exceeds that required by the neighboring flight modules as regards one or more parameters, Accordingly there is a danger of erasure in that particular hybrid of prior flight modules of which the "neighbors" on the other hand do remain in the other hybrids. The different stages discussed above concerning resetting in the memory of the invention do take this circumstance into account.

In a variation of the invention, the above described hybrid circuits can be replaced by the so-called PLCC (Plastic Leadless Chip Carrier) illustratively marketed by XICOR (USA). This company illustratively sells 256 k bits under the name X28 256 PLCC case J or JI depending on the rated temperature range that such circuits ordinarily can withstand.

In the above described embodiment mode, two memory assemblies have been described, each comprising four hybrid circuits in a case. The variation consists in replacing each hybrid circuit case by a plurality of PLCC type chips, illustratively the model above.

Applicant found that these PLCC chips are inherently hermetic to air. By using such chips, it is no longer necessary to fill with an inert product as required for the hybrid circuit cases.

Lastly, the material structure of the recorder also may vary. In particular by using PLCC circuits, instead of two cards each comprising one of the memory assemblies, it may be necessary to use several cards for each memory assembly alone, that is, two sets of cards each assigned to one of the memory assemblies.

We claim:

1. A flight-recorder of the type comprising an enclosed protection chassis crossed by electric-power connectors and by signal connectors ending at memory means inside the protection chassis, and having non-volatile, electrical rewrite memory circuits which can be accessed by said signal connectors to store flight data, the memory means having at least one memory-circuit card and one control circuit card suitable as an interface with the electrical rewrite memory circuits, such a memory-circuit card comprising means for receiving an auxiliary memory-access connector to access data in the memory circuits thereof in the event of operational incapacity of the control card.

2. A flight recorder as defined in claim 1 wherein the control card comprises several circuit levels placed between the connectors and at least a portion of the memory-circuit cards, these circuit levels serving as fuses in the event of excessive input voltage to protect the memory-circuit cards from such voltages.

3. A flight recorder as defined in claim 1 further comprising a plurality of input connections to the memory means and fast unidirectional Zener diodes connected to ground for each input connection to the memory means.

4. A flight recorder as defined in claim 1 wherein the memory circuits each comprise plastic leadless chip carrier integrated-circuit chips.

5. A flight recorder as defined in either of claims 1 or 4 wherein the memory circuits are mounted in a metal case having an open side on a side opposite connection lugs on the other side, the memory circuits and lugs being coated with a resin and comprising a solid silicone product filling the remainder of the case.

6. A flight recorder as defined in one of claims 1, 2 or 3 wherein the memory-circuit cards are mounted spaced apart inside the protection chassis and further comprising glass micro-balls wedging the memory-circuit cards in place, and flexible printed circuit means for connecting the memory-circuit cards.

7. A flight recorder as defined in one of claims 1, 2 or 3 comprising means for alternatingly recording flight parameters in two different memory zones whereby, in the event of total or partial malfunction of one of the two zones, all the flight time will be available at half rate.

8. A flight recorder as defined in one of claims 1, 2 or 3 comprising a plurality of spaced apart memory-circuit assemblies, each memory-circuit assembly comprising at least one memory circuit and means for feeding consecutive measurements to be recorded alternatingly to at least two spaced apart memory-circuit assemblies and feeding consecutive sets of data to be recorded in each memory-circuit assembly sequentially to different memory circuits.

9. A flight recorder as defined in claim 8 comprising a plurality of printed circuit cards and wherein the memory-circuit assemblies are each mounted on a separate printed-circuit card which is activated by the control circuit card separately from each other printed-circuit card.

10. A flight recorder as recited in claim 1 wherein the control circuit card comprises means for protecting input connections to the memory circuits from excessive input signal levels.

11. A flight recorder for recording flight parameters of the type comprising an enclosed protection chassis crossed by electric-power connectors and by signal-connectors ending in memory means inside the protection chassis and further comprising non-volatile, electric rewrite memory circuits accessible through said connectors, comprising a plurality of memory-circuit cards, each memory circuit card comprising a plurality of said electric rewrite memory circuits, and means for feeding consecutive measurements to be recorded alternatingly to the electric rewrite memory circuits of at least two of said memory-circuit cards, and means for feeding consecutive sets of data to be recorded in each memory-circuit card sequentially in a different electric rewrite memory circuit on the memory-circuit card.

12. A flight recorder as defined in claim 11 comprising means for generating a sequence of "flight module" sets of data, each set containing an integral number of cycles, each cycle comprising all of the flight parameters to be recorded.

13. A flight recorder of the type comprising an enclosed protection chassis crossed by electric-power connectors and by signal-connectors ending in memory means inside the protection chassis and comprising non-volatile, electric rewrite memory circuits accessible through said signal-connectors, comprising at least one memory-circuit card having a plurality of memory zones, and means for alternatingly recording flight parameters in two different memory zones of the same memory-circuit card whereby, in the event of total or partial failure of one of the two zones all the flight data recorded on the circuit card will be available at half rate.

14. A flight recorder as defined in claim 13 comprising means for generating a sequence of "flight module" sets of data, each set containing an integral number of cycles, each cycle comprising all of the flight parameters to be recorded.

15. A flight recorder of the type comprising a protection chassis crossed by electric-power connectors and by signal-connectors ending in logic means inside the protection chassis and further comprising a plurality of memory-circuit assemblies each memory-circuit assembly comprising a plurality of non-volatile, electric rewrite memory circuits accessible through said signal-connectors for recording flight parameters, comprising means for generating a sequence of "flight module" sets of data, each set containing an integral number of cycles, each cycle comprising all of the flight parameters to be recorded, and means for separately recording each of the generated sets of data in the electric rewrite memory circuits of at least two memory-circuit assemblies.

16. A flight recorder as defined in either of claims 11 or 13 wherein the electric rewrite memory circuits are electrically activated separately.

17. A flight recorder for recording flight parameters as defined in any one of claims 12, 14 or 15 wherein the means for generating a sequence of "flight module" sets of data comprises means for generating a flight module containing a reference cycle comprising a recorded block of data forming a complete coding of all of the flight parameters to be recorded, followed by secondary cycles comprising data blocks, each data block comprising an identifier capable of assuming at least three different states while the remainder of the block is:

nonexistent if the identifier shows that a flight parameter did not deviate from its previous value within a selected precision, made up of a restricted number of coding bits if the identifier shows that the flight parameter varied only within a selected restricted range relative to its previous value, and made up of all the coding bits in the other case.

18. A flight recorder as defined in claim 17 wherein the means for generating a sequence of "flight module" sets of data comprises means for association each flight module with an initial recording of a flight identification and with the time elapsed since a flight began.

19. A flight recorder as defined in claim 18 comprising means for resetting the memory means following power-supply interruption by searching through the memory means for finding first a synchronizing signal concerning the most recent flight module, and then following the flight modules by going back in time.

20. A flight recorder as defined in claim 19 wherein the means for resetting comprises means for following a data block concerning a flight cycle by an indication of the number of bits contained in such a data block and following a set of data defining a flight module by an indication of the number of bits contained in the set and then by at least one special synchronizing signal.

21. A flight recorder as defined in claim 19 wherein the means for resetting comprises means for determining the earliest flight of which all the flight modules are present in the memory.

22. A flight recorder as defined in claim 17 wherein the means for generating a sequence of "flight module" sets of data comprises means for assuring that each data block concerning a flight cycle is followed by an indication of the number of bits contained in such a block and each set of data defining a flight module is followed by an indication of the number of bits contained in the set and then by at least one special synchronizing signal.

23. A flight recorder as defined in claim 22 comprising means for resetting the memory means following power-supply interruption by searching through the memory means for finding first a synchronizing signal concerning the most recent flight module, and then following the flight modules by going back in time.

24. A flight recorder as defined in claim 23 wherein the means for resetting comprises means for determining the earliest flight of which all the flight modules are present in the memory.

* * * * *